(12) United States Patent
Yamanaka et al.

(10) Patent No.: US 7,154,715 B2
(45) Date of Patent: Dec. 26, 2006

(54) MAGNETORESISTIVE ELEMENT AND MAGNETIC HEAD

(75) Inventors: Hideaki Yamanaka, Mishima-gun (JP); Kesami Saito, Sendai (JP); Koki Takanashi, Sendai (JP); Hiroyasu Fujimori, Sendai (JP)

(73) Assignee: Western Digital (Fremont), Inc., Fremont, CA (US)

( * ) Notice: Subject to any disclaimer, the term of this patent is extended or adjusted under 35 U.S.C. 154(b) by 145 days.

(21) Appl. No.: 10/259,022

(22) Filed: Sep. 26, 2002

(65) Prior Publication Data

US 2003/0026048 A1 Feb. 6, 2003

Related U.S. Application Data

(62) Division of application No. 09/325,888, filed on Jun. 4, 1999, now Pat. No. 6,597,548.

(30) Foreign Application Priority Data

Jun. 5, 1998 (JP) ................................. 10-172062

(51) Int. Cl.
*G11B 5/39* (2006.01)

(52) U.S. Cl. ..................................... 360/324.2; 360/126

(58) Field of Classification Search ............. 360/324.2, 360/324.12; 438/3; 257/421
See application file for complete search history.

(56) References Cited

U.S. PATENT DOCUMENTS

| | | | | |
|---|---|---|---|---|
| 5,747,859 A | * | 5/1998 | Mizushima et al. | 257/421 |
| 5,930,087 A | * | 7/1999 | Brug et al. | 360/324.1 |
| 5,966,275 A | * | 10/1999 | Iijima | 360/324.2 |
| 5,973,334 A | * | 10/1999 | Mizushima et al. | 257/25 |
| 5,986,858 A | * | 11/1999 | Sato et al. | 360/324.2 |
| 6,011,674 A | * | 1/2000 | Nakatani et al. | 360/324.2 |
| 6,026,559 A | * | 2/2000 | Ishiwata | 29/603.14 |
| 6,047,462 A | * | 4/2000 | Miyauchi et al. | 29/603.14 |
| 6,108,177 A | * | 8/2000 | Gill | 360/324.12 |
| 6,110,751 A | * | 8/2000 | Sato et al. | 438/3 |
| 6,178,074 B1 | * | 1/2001 | Gill | 360/324.2 |
| 6,847,508 B1 | * | 1/2005 | Tanaka et al. | 360/324.12 |

* cited by examiner

*Primary Examiner*—Tianjie Chen
(74) *Attorney, Agent, or Firm*—Burgess & Bereznak

(57) ABSTRACT

A magnetic transducing element in which a ferromagnetic tunneling junction film, including first and second ferromagnetic layers and an insulating layer are enclosed between the ferromagnetic layers, and a nonmagnetic metal thin film is inserted between the second ferromagnetic layer and the insulating layer, is formed on a substrate.

10 Claims, 7 Drawing Sheets

MAGNETORESISTIVE ELEMENT AND MAGNETIC HEAD

The present application is a divisional application of Ser. No. 09/325,888, now U.S. Patent No. 6,597,548, filed Jun. 4, 1999.

BACKGROUND OF THE INVENTION

1. Field of the Invention

The present invention concerns a magnetic transducing element utilizing the magnetoresistance effect of a ferromagnetic tunneling junction consisting of a ferromagnet/insulator/ferromagnetic structure; it can be used in magnetic heads, magnetic sensors, magnetic memories, and other applications. In addition, the present invention concerns a magnetic head equipped with such a magnetic transducing element.

2. Background Information

In the field of magnetic recording technology, AMR (anisotropic magnetoresistive) heads utilizing the magnetoresistance effect have been employed as a read head to replace the usual inductive heads, in order to satisfy recent demands for higher recording densities; and in addition, still more sensitive spin-valve heads have been developed. Even more recently, a ferromagnetic tunneling junction magnetic transducing element has been proposed, as described in Unexamined (Laid-Open) Patent Application Publication Hei8-70149 and in the paper by Masashige Sato et al, "Magnetoresistance Effect of a Ferromagnetic Tunneling Junction with Magnetization-Fixing Layer" (*Journal of the Magnetics Society of Japan*, Vol. 21, No. 4-2, 1997, p. 489–492).

As shown in cross-section in FIG. 12, this magnetic transducing element has formed, on a substrate 4 (or on a base layer covering said substrate), a ferromagnetic tunneling junction film in which an insulating film 1, sufficiently thin that electrons can tunnel, is enclosed between ferromagnetic layers 2, 3, so that when electrons tunnel through the aforementioned insulating layer, a magnetoresistance effect is obtained utilizing the difference $\Delta R$ between the resistance value $R_p$ in the state in which the magnetizations in the two ferromagnetic layers are parallel, and the resistance value $R_{ap}$ in the state in which they are antiparallel. Theoretically, a magnetoresistance ratio ($\Delta R/R$) of 20 to 50%, higher than for the usual AMR elements and spin-valve elements, can be expected; and even at the experimental level, magnetoresistance ratios of approximately 10% and higher have been obtained at room temperature.

However, magnetic transducing elements based on the above-described ferromagnetic tunneling junction of the prior art are plagued by a problem in which, generally, when a bias voltage of from several tens to several hundreds of millivolts is applied, the magnetoresistance ratio is greatly decreased. For example, in the paper by Terunobu Miyazaki, "GMR of Ferromagnetic Tunneling Junctions" (*Kotai Butsuri*, Vol. 32, No. 4, 1997), it is reported that application of a 30 mV bias voltage causes the magnetoresistance ratio to decrease to approximately one-half its maximum value, and in the paper by A. C. Marley et al, "Voltage Dependence of the Magnetoresistance and the Tunneling Current in Magnetic Tunnel Junctions" (J. Appl. Phys. 81(8), published Apr. 15, 1997), it is reported that at 200 mV the magnetoresistance ratio decreased to approximately one-half. Such a decrease in magnetoresistance ratio accompanying application of a bias voltage is undesirable for purposes of practical application of ferromagnetic tunneling junction magnetic transducing elements.

SUMMARY OF THE INVENTION

A magnetoresistive element having a ferromagnetic tunneling junction film is disclosed. In one embodiment, the disclosed magnetoresistive element includes a first ferromagnetic layer formed on a substrate, a second ferromagnetic layer, an insulating layer between the first and second ferromagnetic layers and a nonmagnetic metal thin film between at least one of the first and second ferromagnetic layers and the insulating layer in the ferromagnetic tunneling junction film. Additional features and benefits of the present invention will become apparent from the detailed description, figures and claims set forth below.

Figure 1:
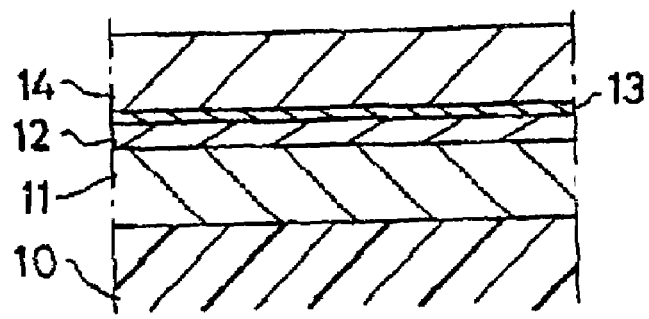
FIG. 1 is a cross-sectional view showing the construction of the first working example of a magnetoresistive element of the present invention.

Explanations of the Symbols
1 Insulating layer
2,3 Ferromagnetic layer
4,10 Substrate
11 First ferromagnetic layer
12 Insulating layer
13 Nonmagnetic metal layer
14 Second ferromagnetic layer
15 Nonmagnetic metal layer
16,17 Layer
18 Antiferromagnetic layer
19,20 Electromagnet
21 to 24 Electrodes

DETAILED DESCRIPTION

The present invention was devised in consideration of the aforementioned problem of the prior art; its objective is to suppress the decrease in magnetoresistance ratio due to application of a bias voltage, to provide a ferromagnetic tunneling junction magnetoresistive element suited for use in a variety of applications. In addition, another objective of the present invention is to provide a magnetic head, equipped with such a magnetoresistive element with high magnetoresistance ratio, for use at higher recording densities. The present invention is intended to achieve the aforementioned objectives, and is explained below using a working example illustrated in the drawings.

The present invention provides a practical application of magnetoresistive elements utilizing the magnetoresistance effect based on a ferromagnetic tunneling junction. The present invention eliminates or considerably limits the generation of magnons occurring at the insulating layer/ferromagnetic layer tunneling junction interface, and suppresses the decrease in magnetoresistance ratio due to application of a bias voltage. With the present invention, a magnetic head suited to still higher-density recording is obtained.

The magnetoresistance element of the present invention has a ferromagnetic tunneling junction film consisting of a first ferromagnetic layer formed on a substrate and a second ferromagnetic layer, and an insulating layer between the aforementioned ferromagnetic layers, and is characterized by the presence in the ferromagnetic tunneling junction film, between at least one of the aforementioned ferromagnetic layers and the aforementioned insulating layer, of a nonmagnetic metal thin film. Moreover, a separate aspect of the present invention is the presentation of a magnetic head equipped with such a magnetic transducing element.

In the past, magnon generation has been regarded as one possible cause of the decrease in magnetoresistance ratio accompanying the application of a bias voltage. That is, at the insulating layer/ferromagnetic layer tunneling junction interface, when electrons tunnel, magnons, that is, spin waves are generated. As a result of the generation of these magnons, when electrons tunnel the directions of spins are not preserved, and the magnetoresistance ratio decreases. Hence when a bias voltage is applied a greater number of magnons is generated, and the magnetoresistance ratio decreases.

In the present invention, by inserting a nonmagnetic metal layer between a ferromagnetic layer and the insulating layer of the ferromagnetic tunneling junction film as described above, generation of magnons at the tunneling interface is eliminated or at least greatly limited, and the decrease in magnetoresistance ratio on application of a bias voltage is suppressed.

It is desirable that the aforementioned nonmagnetic metal thin film consist of one or of two or more metals selected from the group consisting of Cu, Ag, Au, Al, Pt and Zn, and that the film thickness is in the range from 2 to 20 Å.

Moreover, as has been known by persons skilled in the art for some time, when a ferromagnetic material with high polarizability is inserted in the insulating layer/ferromagnetic layer interface, the magnetoresistance ratio rises. Hence it is desirable that the aforementioned first or second ferromagnetic layer be formed from layers of two or more different ferromagnetic materials.

In a separate working example of the present invention, a spin-valve type magnetoresistive element is provided having an antiferromagnetic layer formed on top of the aforementioned second ferromagnetic layer. By this means, the sensitivity of the spin-valve element can be greatly increased.

FIG. 1 shows the configuration of the first working example of a magnetoresistive element of the present invention. On top of the first ferromagnetic layer 11 formed on the substrate 10, covered by an insulating layer not shown, is formed a thin insulating layer 12. On top of the insulating layer 12 is formed an extremely thin nonmagnetic metal layer 13; and on top of this is formed the second ferromagnetic layer 14. Each of these layers 11 to 14 comprising the ferromagnetic tunneling junction film can be formed by sputtering, for example, by vacuum deposition, or using other widely-known methods and equipment of film formation.

The aforementioned ferromagnetic layers can be formed from ferromagnetic materials such as the widely known Fe, Ni or Co, or NiFe, CoFe and other alloys expressed by the general formula $Ni_xFe_yCo_{1-x-y}$, or NiMnSb and other ferromagnetic materials. As the aforementioned insulating layer, $Al_2O_3$, NiO, $HfO_2$, MgO, CoO, Ge, $GdO_x$ or other materials may be used.

The nonmagnetic metal layer 13 is formed from one kind, or from two or more kinds of metals selected from the group consisting of Cu, Ag, Au, Al, Pt and Zn. The film thickness of the aforementioned nonmagnetic metal layer is extremely thin to enable retention of the polarizability of the ferromagnetic layers even within the nonmagnetic metal layer, and in consideration of the film thickness of the insulating layer 12, is set within the range 2 to 20 Å.

By inserting such a nonmagnetic metal layer between the insulating layer 12 and the second ferromagnetic layer 14, the decrease in magnetoresistance ratio when a bias voltage is applied is greatly reduced. This is thought to be because, as described above, generation of magnons at the insulating layer/ferromagnetic layer tunneling interface is suppressed. In a separate working example, a nonmagnetic metal layer 13 can be inserted between the first ferromagnetic layer 11 and the insulating layer 12, and in this case also a similar effect is obtained.

Figure 2:
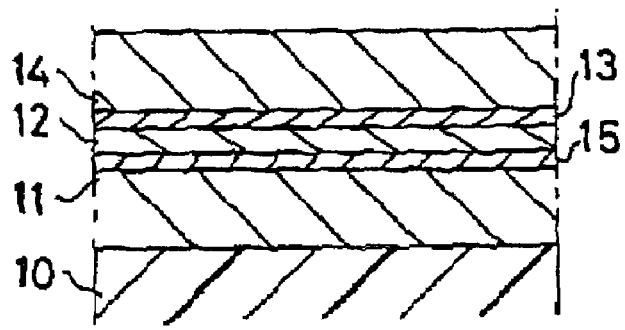
FIG. 2 is a cross-sectional view similarly showing a modification of the example of FIG. 1.

FIG. 2 shows a modification of the first working example of FIG. 1; a second nonmagnetic metal layer 15 is inserted between the first ferromagnetic layer 11 and the insulating layer 12. By this means the generation of magnons at the tunneling interface is more effectively eliminated, and the decrease in magnetoresistance ratio on application of a bias voltage is suppressed more completely.

Figure 3:
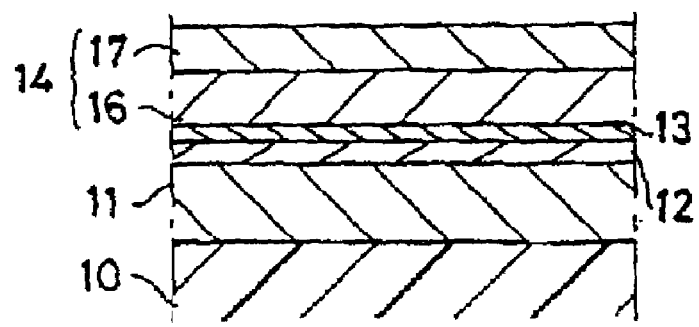
FIG. 3 is a cross-sectional view showing a different modification of the example of FIG. 1.

FIG. 3 shows a different modification of the aforementioned first working example; the second ferromagnetic layer 14 is formed from two different ferromagnetic material layers 16, 17. In the prior art, it is known that when ferromagnetic material with large polarizability is inserted at the insulating layer/ferromagnetic layer interface, the magnetoresistance ratio rises. Hence when, for example, the ferromagnetic layer 16 adjacent to the insulating layer 12 and nonmagnetic metal layer 13 is formed from Co, and the other ferromagnetic layer 17 is formed from NiFe, a higher magnetoresistance ratio is obtained. Further, instead of the second ferromagnetic layer, or in addition to the second ferromagnetic layer, the first ferromagnetic layer 13 can also similarly be formed from two different ferromagnetic material layers.

Figure 4:
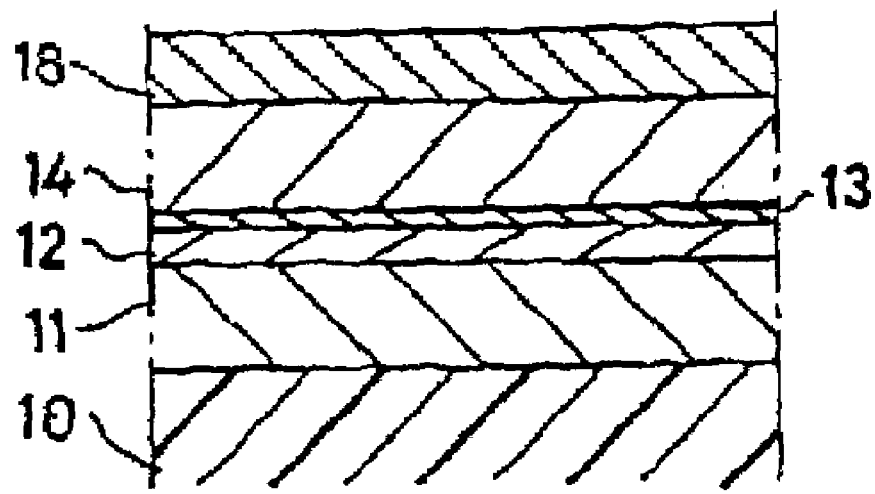
FIG. 4 is a cross-sectional view showing the second working example of the present invention.

The present invention can also be applied to spin-valve type magnetoresistance elements. In FIG. 4 is shown a second working example of such a magnetoresistance element of the present invention; an antiferromagnetic layer 18 is formed on top of the ferromagnetic tunneling junction film of FIG. 1. The antiferromagnetic layer 18 can be formed, as in the prior art, from well-known antiferromagnetic materials such as FeMn, IrMn, NiMn, PtMn, or NiO, using sputtering, for example. By this means, the sensitivity of spin-valve elements can be greatly improved over those of the prior art.

In the working example of FIG. 4 also, in order to obtain a higher magnetoresistance ratio similarly to the working example of FIG. 3, the second ferromagnetic layer 14 can be formed from layers of two or more different ferromagnetic materials. Further, a nonmagnetic metal layer 13 can be inserted between the first ferromagnetic layer 11 and the insulating layer 12.

Figure 5:
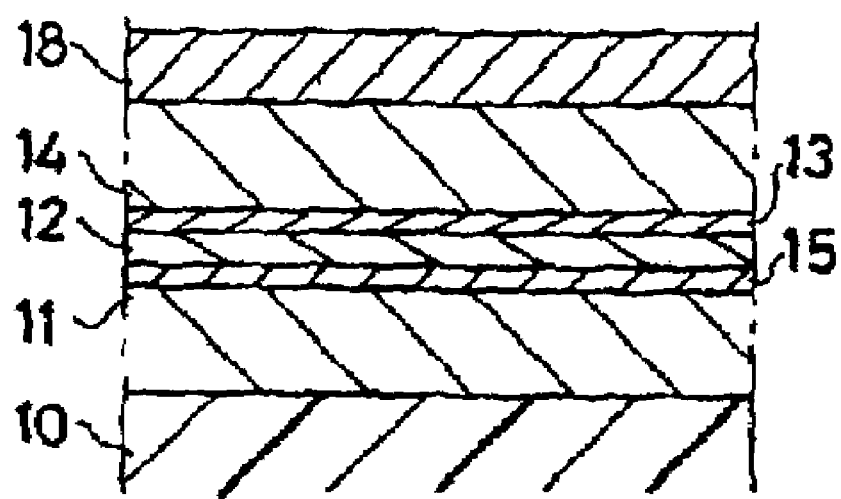
FIG. 5 is a cross-sectional view showing a modification of the example of FIG. 4.

FIG. 5 shows a modification of the second working example of FIG. 4; similarly to the working example of FIG. 2, a nonmagnetic metal layer 15 is inserted between the first ferromagnetic layer 11 and the insulating layer 12. By this means, the generation of magnons at the tunneling interface can similarly be effectively eliminated.

Figure 6:
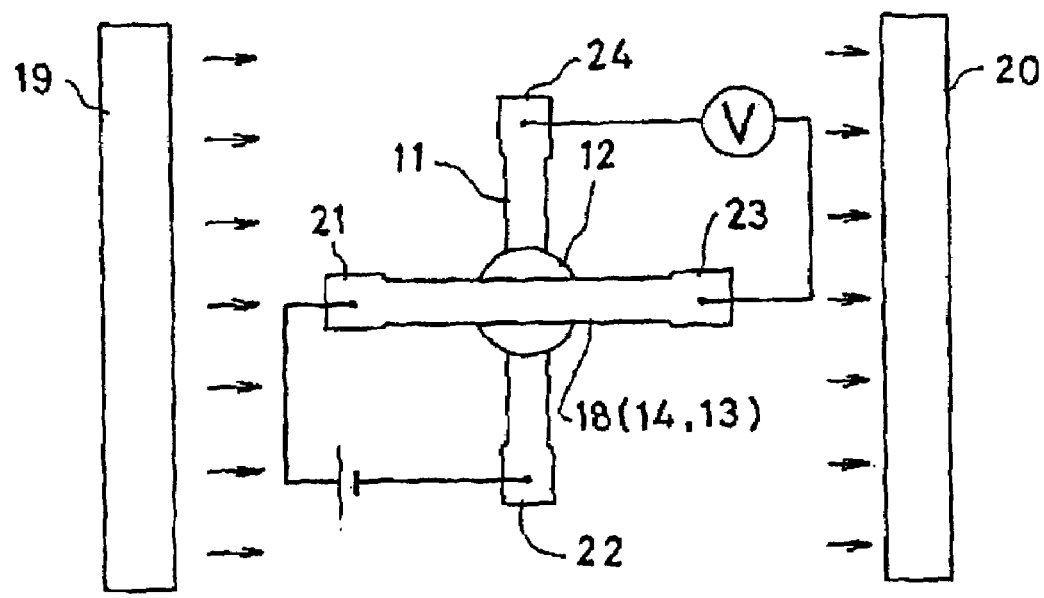
FIG. 6 is a schematic plan view showing the ferromagnetic tunneling junction film of the first working example used in magnetoresistance ratio measurement experiments, and the experimental method.
Figure 7:
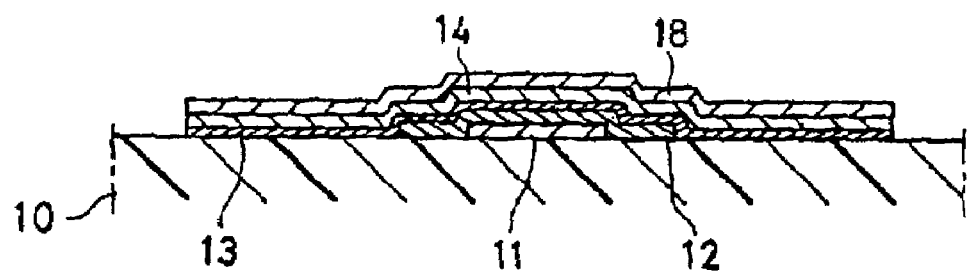
FIG. 7 is a cross-sectional view of the ferromagnetic tunneling junction film of FIG. 6.

Using ion beam sputtering equipment, the ferromagnetic tunneling junction film of the working example of FIG. 4 was formed on a substrate, and the change in magnetoresistance ratio with the bias voltage was measured. First a metal mask was used to sputter-deposit Fe to a film thickness of 1000 Å in a vacuum chamber on top of Si substrate 10 covered with an insulating layer, as shown in FIGS. 6 and 7, to form the stripe-shaped first ferromagnetic layer 11. Next the mask was changed, and after sputter-depositing Al in a circle shape to a film thickness of 10 to 20 Å on top of the first ferromagnetic layer 11, oxygen was introduced into the aforementioned vacuum chamber from an assisting ion source, and the Al film was oxidized to form the insulating layer 12 consisting of $Al_2O_3$.

Next the mask was changed and Cu was sputter-deposited to a film thickness of 5 Å, to form a stripe-shaped nonmagnetic metal layer 13 oriented perpendicularly to the first ferromagnetic layer 11. Using the same mask, a Co(30 Å)/NiFe(150 Å) film was deposited continuously to form the second ferromagnetic layer 14, and then a 400 Å thick FeMn film was deposited as the antiferromagnetic layer 18.

Electromagnets 19, 20 were positioned on both the left and right sides of the ferromagnetic tunneling junction film thus formed, and a constant magnetic field was applied in the direction of the stripes of the nonmagnetic metal layer 13 and the second ferromagnetic layer 14; in this state, a constant current was passed between two electrodes 21, 22 provided on the ends of the antiferromagnetic layer 18 and the first ferromagnetic layer 11 respectively, and the voltage across electrodes 23, 24 provided on the opposite ends of each was measured at room temperature (290K) and at 77K. Here, if the resistance when the magnetization directions in both the aforementioned ferromagnetic layers are parallel is $R_p$, and the resistance when they are antiparallel is $R_{ap}$, then the magnetoresistance ratio is found from the equation $\Delta R/R=(R_{ap}-R_p)/R_p$.

Figure 8A:
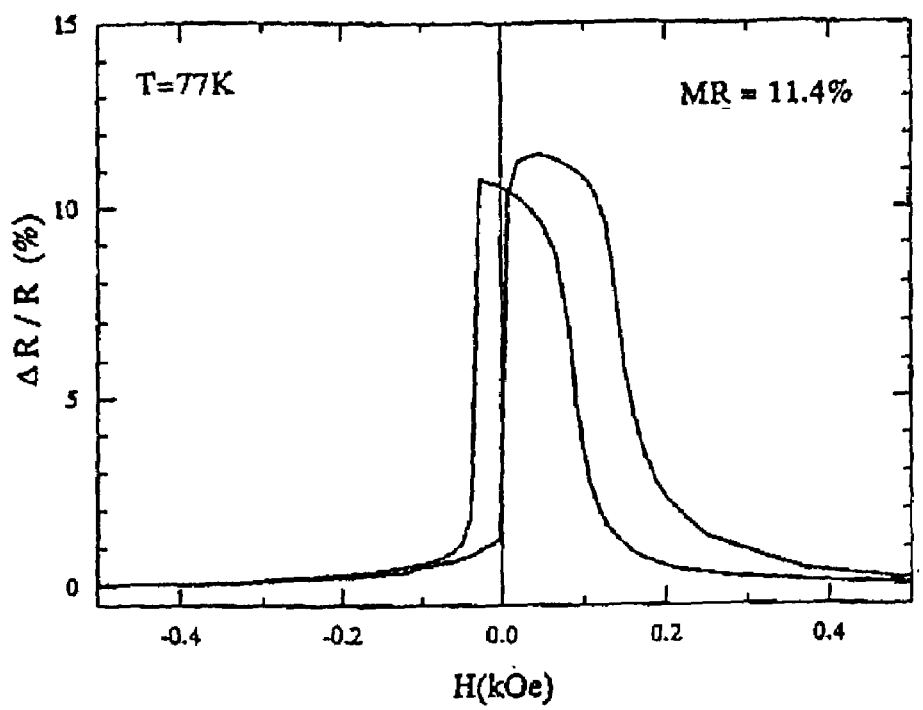
FIGS. 8A and 8B are line graphs showing the magnetoresistance curves for working example 1 and comparative example 1 respectively, measured at 77K.
Figure 8B:
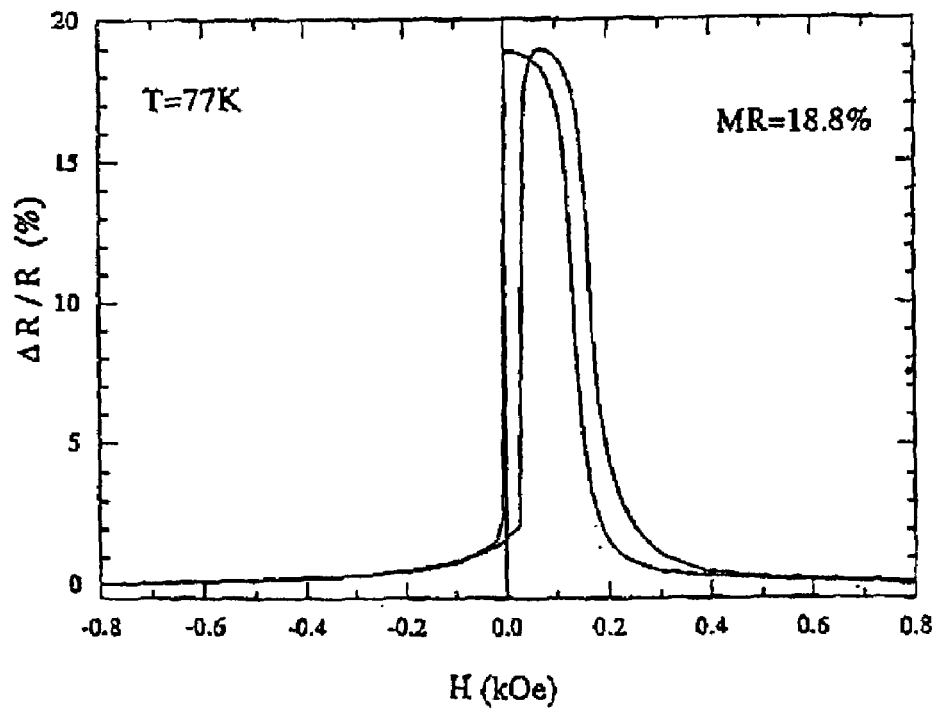
Figure 9A:
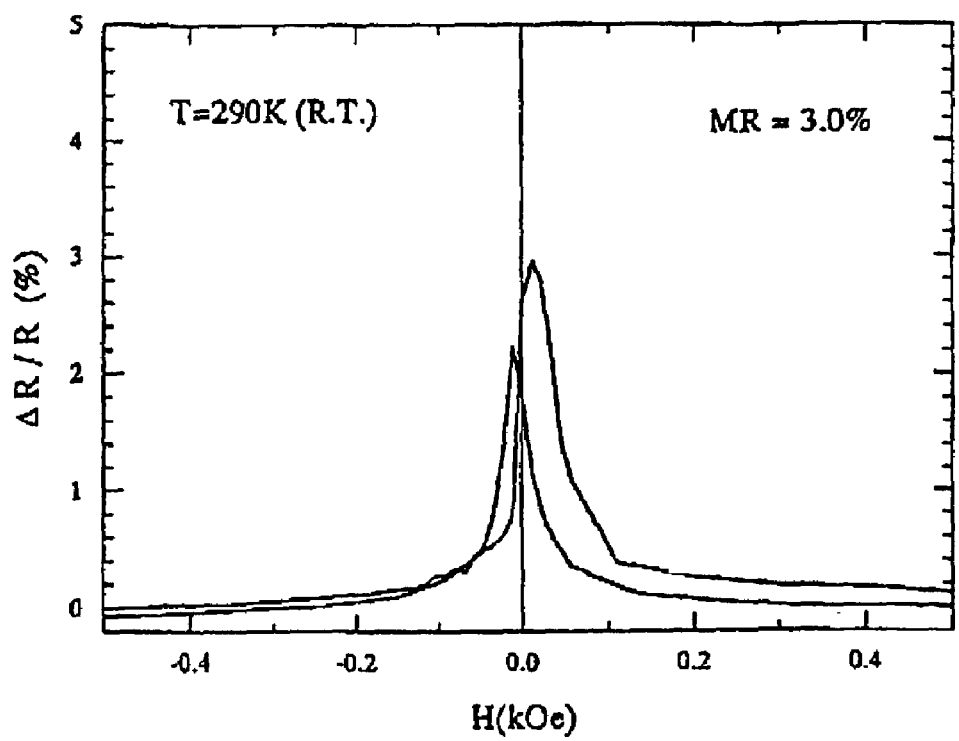
FIGS. 9A and 9B are line graphs showing the magnetoresistance curves for working example 1 and comparative example 1 respectively, measured at room temperature (290K).
Figure 9B:
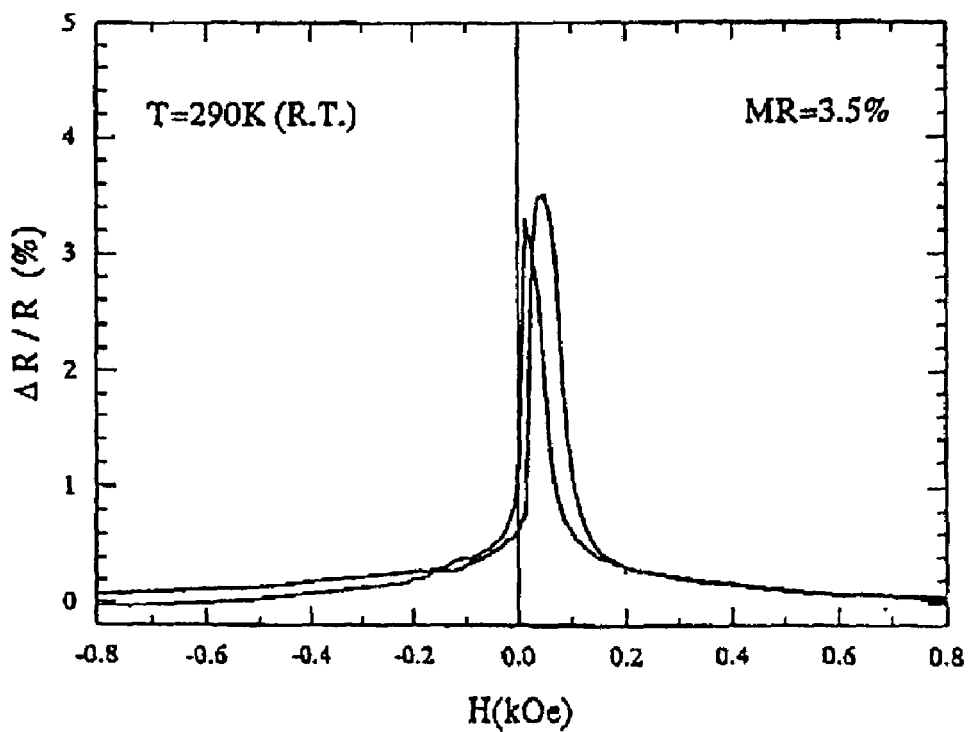

As a first comparative example, a ferromagnetic tunneling junction film with a structure of the prior art consisting of Fe/$Al_2O_3$/Co/NiFe/FeMn was formed using similar techniques, and changes in its magnetoresistance ratio were similarly measured. The magnetoresistance curves obtained when the bias voltage was 1 mV are shown in FIGS. 8 and 9. Whereas, when a 100 mV voltage was applied, the magnetoresistance ratio of the ferromagnetic tunneling junction film with the structure of the prior art decreased to approximately one-half its maximum value, the magnetoresistance ratio of the ferromagnetic tunneling junction film of the present working example decreased by approximately ⅕ to ⅓, and the decrease was much smaller than in the case of the prior art.

In the working example of FIG. 1, an Au film of thickness 5 [Å] was used as the nonmagnetic metal layer 13, and moreover this was inserted between the first ferromagnetic layer 11 and the insulating layer 12, and techniques similar to those of the aforementioned working example 1 were used to fabricate a ferromagnetic tunneling junction film with the structure Fe(1000 Å)/Au(5 Å)/Al(15 Å)-O/NiFe (250 Å)/FeMn(400 Å). As comparative example 2, a ferromagnetic tunneling junction film was formed with a structure of the prior art, Fe(1000 Å)/Al(15 Å)-O/NiFe(250 Å)/FeMn(400 Å).

Figure 10:
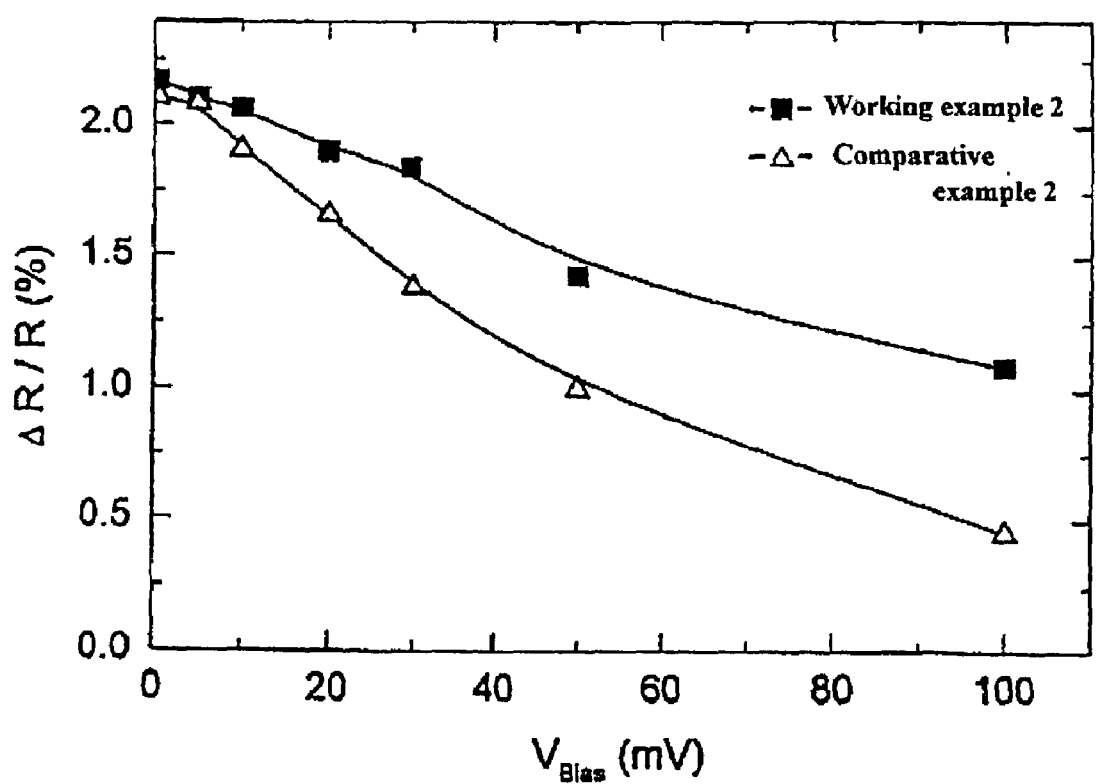
FIG. 10 is a line graph showing the bias voltage dependence of the magnetoresistance ratio of the tunneling junction films of working example 2 and comparative example 2.

The change in magnetoresistance ratio with bias voltage in the ferromagnetic tunneling junction film of this working example and comparative example 2 was measured at 77K by a method similar to that of the aforementioned working example 1, and the results are shown in FIG. 10. That is, FIG. 10 shows the bias voltage dependence of the magnetoresistance ratio for this working example and for comparative example 2; clearly the decrease in magnetoresistance ratio for this working example is smaller by approximately one-half than that of comparative example 2 over the entire range of measurement of bias voltages, from 0 to 100 mV.

Figure 11:
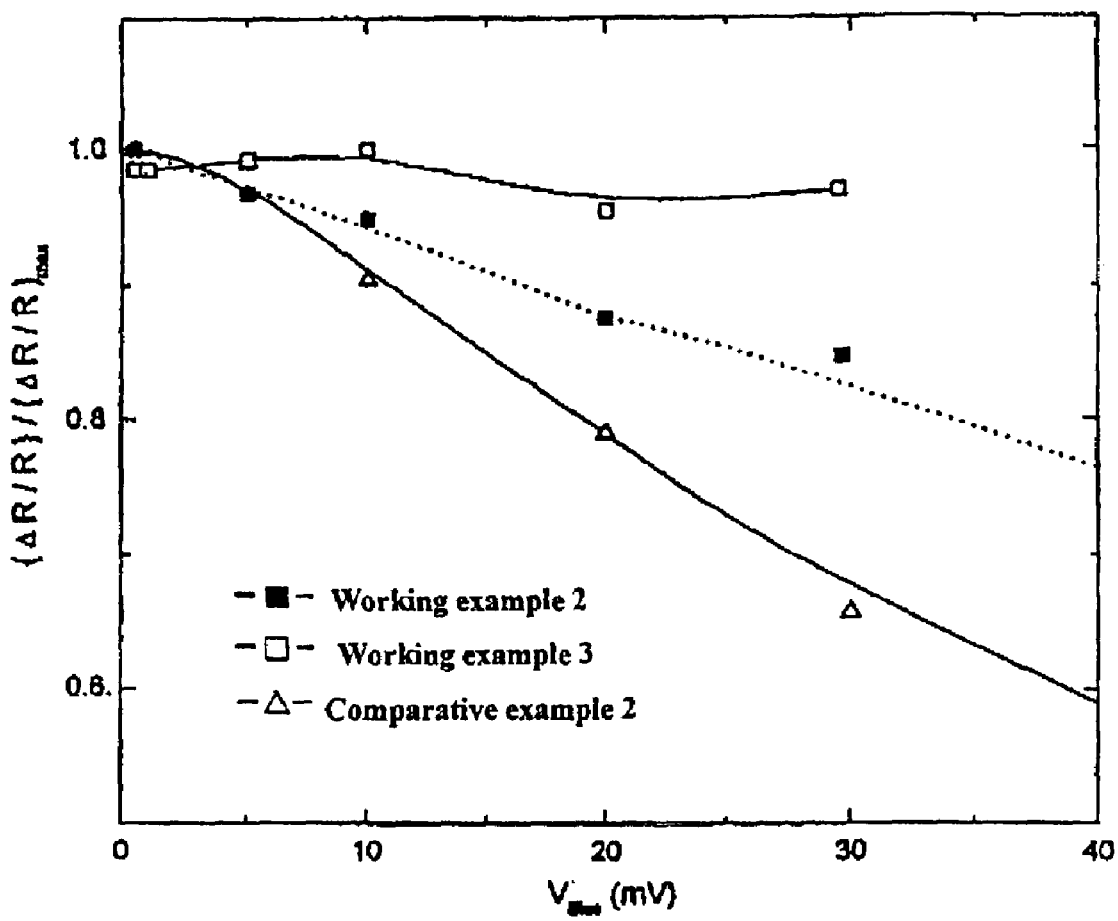
FIG. 11 is a line graph of the measured values of the magnetoresistance ratio of FIG. 10, normalized by dividing by the maximum value.
Figure 12:
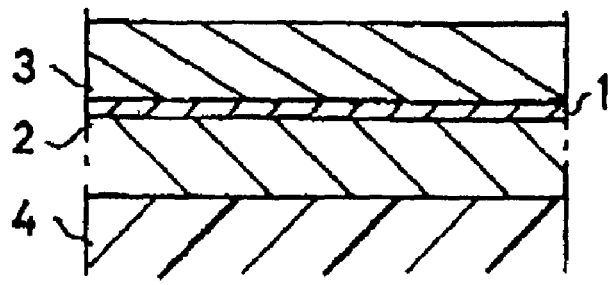
FIG. 12 is a cross-sectional view showing a magnetoresistive element of a ferromagnetic tunneling junction of the prior art.

Further, FIG. 11 shows more clearly the bias voltage dependence of the magnetoresistance ratio, normalizing the measurement results of FIG. 10 for bias voltage versus magnetoresistance ratio by dividing them by their maximum values. From this figure also it is clear that the decrease in magnetoresistance ratio for this working example is smaller by approximately one-half than that for comparative example 2.

Similarly, an Au film of thickness 10 Å was used as the nonmagnetic metal layer 13 in the working example of FIG. 1, and a ferromagnetic tunneling junction film was formed by methods similar to those of the aforementioned working example 1, having the structure Fe(1000 Å)/Al(15 Å)-O/Au (10 Å)/NiFe(250 Å)/FeMn(400 Å).

The change in magnetoresistance ratio with bias voltage in this working example was measured at 77K by methods similar to those of the aforementioned working example 1; the results were normalized by dividing the magnetoresistance ratio versus bias voltage by their maximum values, and are shown in FIG. 11. In this working example, the decrease in magnetoresistance ratio is even smaller than in the aforementioned working example 2.

The present invention is configured as described above, and so offers the following advantageous results.

A magnetic transducing element of the present invention has a nonmagnetic metal layer inserted between a ferromagnetic layer and the insulating layer of a ferromagnetic tunneling junction film, and so generation of magnons at the tunneling interface when electrons tunnel is suppressed, so that decreases in the magnetoresistance ratio due to application of a bias voltage are suppressed, and use in a variety of applications is possible. In particular, a magnetic head equipped with such a magnetoresistive element can be utilized as a read head with higher sensitivity than in the prior art, and still higher recording densities can be accommodated.

What is claimed is:

1. A single-sided ferromagnetic tunneling junction magnetoresistive element comprising:
   a substrate;

a first ferromagnetic layer having a first material composition, the first ferromagnetic layer being disposed adjacent the substrate;

a second ferromagnetic layer having a second material composition different from the first material composition, the second ferromagnetic layer being disposed above the first ferromagnetic layer;

an antiferromagnetic layer disposed above the second ferromagnetic layer;

an insulating layer disposed between the first and second ferromagnetic layers; and a nonmagnetic metal layer disposed between the insulating layer and the second ferromagnetic layer, the nonmagnetic metal layer adjoining the second ferromagnetic layer.

2. The ferromagnetic tunneling junction magnetoresistive element of claim 1 wherein the nonmagnetic metal layer has a thickness in a range of 2 to 20 angstroms.

3. The ferromagnetic tunneling junction magnetoresistive element of claim 1 wherein the antiferromagnetic layer comprises a material selected from the group consisting of FeMn, IrMn, NiMn, PtMn, and NiO.

4. The ferromagnetic tunneling junction magnetoresistive element of claim 1 wherein the first ferromagnetic layer comprises a material selected from the group consisting of Fe, Ni, Co, NiFe, CoFe, $Ni_xFe_yCo_{1-x-y}$, and NiMnSb.

5. The ferromagnetic tunneling junction magnetoresistive element of claim 1 wherein the insulating layer comprises a material selected from the group consisting of $Al_2O_3$, NiO, Co, NiFe, $HfO_2$, MgO, CoO, and GeGdO.

6. A single-sided ferromagnetic tunneling junction magnetoresistive element comprising:

a substrate;

a first ferromagnetic layer having a first material composition, the first ferromagnetic layer being disposed adjacent the substrate;

a second ferromagnetic layer having a second material composition different from the first material composition, the second ferromagnetic layer being disposed above the first ferromagnetic layer;

an antiferromagnetic layer disposed above the second ferromagnetic layer;

an insulating layer disposed between the first and second ferromagnetic layers; and a nonmagnetic metal layer disposed between the second ferromagnetic layer and the insulating layer, the nonmagnetic metal layer adjoining the Insulating layer on one side and the second ferromagnetic layer on an opposite side.

7. The ferromagnetic tunneling junction magnetoresistive element of claim 6 wherein the nonmagnetic metal layer has a thickness in a range of 2 to 20 angstroms.

8. The ferromagnetic tunneling junction magnetoresistive element of claim 6 wherein the antiferromagnetic layer comprises a material selected from the group consisting of FeMn, IrMn, NiMn, PtMn, and NiO.

9. The ferromagnetic tunneling junction magnetoresistive element of claim 6 wherein the first ferromagnetic layer comprises a material selected from the group consisting of Fe, Ni, Co, NiFe, CoFe, $Ni_xFe_yCo_{1-x-y}$, and NiMnSb.

10. The ferromagnetic tunneling junction magnetoresistive element of claim 6 wherein the insulating layer comprises a material selected from the group consisting of $Al_2O_3$, NiO, Co, NiFe, $HfO_2$, MgO, CoO, and GeGdO.

* * * * *

UNITED STATES PATENT AND TRADEMARK OFFICE
CERTIFICATE OF CORRECTION

| | | |
|---|---|---|
| PATENT NO. | : 7,154,715 B2 | Page 1 of 1 |
| APPLICATION NO. | : 10/259022 | |
| DATED | : December 26, 2006 | |
| INVENTOR(S) | : Yamanaka et al. | |

It is certified that error appears in the above-identified patent and that said Letters Patent is hereby corrected as shown below:

Col. 8, Line 14: After "the", delete "Insulating" and insert --insulating--.

Signed and Sealed this

First Day of July, 2008

JON W. DUDAS
*Director of the United States Patent and Trademark Office*